US011221355B2

(12) United States Patent
Youn et al.

(10) Patent No.: US 11,221,355 B2
(45) Date of Patent: Jan. 11, 2022

(54) EFFECTIVE SERIES RESISTANCE DISPLAY SENSING (71) Applicant: Apple Inc., Cupertino, CA (US)

(72) Inventors: Sang Y Youn, Cupertino, CA (US); Sun-Il Chang, San Jose, CA (US)

(73) Assignee: Apple Inc., Cupertino, CA (US)

(*) Notice: Subject to any disclaimer, the term of this patent is extended or adjusted under 35 U.S.C. 154(b) by 288 days.

(21) Appl. No.: 15/944,495

(22) Filed: Apr. 3, 2018

(65) Prior Publication Data

US 2019/0079611 A1   Mar. 14, 2019

Related U.S. Application Data (60) Provisional application No. 62/555,912, filed on Sep. 8, 2017.

(51) Int. Cl.
*G01R 27/14*   (2006.01)

(52) U.S. Cl.
CPC ....... *G01R 27/14* (2013.01); *G09G 2320/041* (2013.01)

(58) Field of Classification Search
None
See application file for complete search history.

(56) References Cited

U.S. PATENT DOCUMENTS

| 5,804,979 A * | 9/1998 | Lund | G01R 1/203 324/713 |
| 2007/0096562 A1* | 5/2007 | Bainbridge | G06F 1/26 307/35 |
| 2010/0013867 A1* | 1/2010 | Kim | G09G 3/3233 345/690 |
| 2012/0274877 A1* | 11/2012 | Sasaki | G09G 3/3406 349/69 |
| 2013/0154506 A1* | 6/2013 | Ebisuno | G09G 3/3275 315/294 |
| 2014/0117998 A1* | 5/2014 | Hwang | G09G 3/006 324/511 |
| 2014/0163700 A1* | 6/2014 | Lai | H02H 3/044 700/22 |
| 2014/0239823 A1* | 8/2014 | Ahn | G09G 3/3233 315/161 |
| 2014/0253102 A1* | 9/2014 | Wood | G01R 1/203 324/140 R |
| 2014/0362124 A1* | 12/2014 | Kim | G09G 3/3233 345/690 |
| 2016/0063905 A1* | 3/2016 | Bae | G09G 3/20 345/212 |
| 2016/0086542 A1* | 3/2016 | Lee | G09G 3/3225 345/212 |

(Continued)

*Primary Examiner* — Benjamin X Casarez (74) *Attorney, Agent, or Firm* — Fletcher Yoder, P.C.

(57) ABSTRACT

Methods and systems for compensating display panel operations providing a current from power circuitry over a first path between a display panel and the power circuitry are provided. A sensing current may be injected into the first path via a second path between the power circuitry and the first path. An equivalent series resistance (ESR) of the first path may be calculated using a third path and the sensing current. A processor may compensate for electrical fluctuations from the power circuitry to the display panel based at least in part on the measured ESR.

19 Claims, 9 Drawing Sheets

(56) References Cited

U.S. PATENT DOCUMENTS

| | | | |
|---|---|---|---|
| 2016/0180771 A1* | 6/2016 | Jeong | G09G 3/3258 |
| | | | 345/211 |
| 2016/0260383 A1* | 9/2016 | Shin | G09G 3/3258 |
| 2016/0291059 A1* | 10/2016 | Ausserlechner | G01R 19/32 |
| 2016/0293101 A1* | 10/2016 | Jeong | G09G 3/2007 |
| 2018/0115151 A1* | 4/2018 | Cao | G01R 31/2879 |
| 2018/0301174 A1* | 10/2018 | Arno | G01R 19/0092 |
| 2019/0005883 A1* | 1/2019 | Kim | G09G 3/3233 |
| 2019/0050035 A1* | 2/2019 | Sliech | G06F 1/26 |

* cited by examiner

EFFECTIVE SERIES RESISTANCE DISPLAY SENSING

CROSS REFERENCE TO RELATED APPLICATIONS

This application is a Non-Provisional Patent Application of U.S. Provisional Patent Application No. 62/555,912, entitled "Effective Series Resistance Display Sensing", filed Sep. 8, 2017, which is herein incorporated by reference in its entirety for all purposes.

BACKGROUND

The present disclosure relates generally to techniques to sensing parameters in a display. More specifically, the present disclosure relates generally to techniques for sensing operational parameter changes of the display during operation of the display.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic display panels are used in a plethora of electronic devices. These display panels typically include multiple pixels that emit light. The pixels may be formed using self-emissive units (e.g., light emitting diode) or pixels that utilize units that are backlit (e.g., liquid crystal display). Power supplied to the display panels may pass through various components, such as contacts and traces, that have some resistance. This resistance may change due to temperature and/or operating conditions of the display panel. Accordingly, the power supplied to the display panel may vary, causing emission of the display panel to vary.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Display panel performance may change with temperature and/or operating conditions of the display panel (e.g., current draw and/or locations of content). The display panel performance may change when an effective series resistance (ESR) changes between power circuitry and a display panel. This ESR change causes a current supplied to the display panel to drop. Using real-time measurements of the ESR may enable the display to appear more uniform across multiple different temperatures and/or operating conditions of the display. Furthermore, once the ESR is calculated, the current and/or voltage at an end of a route from the power circuitry to the display panel may be measured. When this current and/or voltage changes, the power circuitry may be driven differently to compensate for the change. For example, when the voltage across an organic light emitting diode (OLED) drops, a corresponding voltage (e.g., ELVDD or ELVSS) may be adjusted in a corresponding direction, such as increasing EVLDD and/or decreasing ELVSS, to achieve a target voltage across the OLED.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. To provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Display panel performance may change with temperature and/or operating conditions of the display panel (e.g., current draw and/or locations of content). The display panel performance may change when an effective series resistance (ESR) changes between power circuitry and a display panel. This ESR change causes a current supplied to the display panel to drop. Using real-time measurements of the ESR may enable the display to appear more uniform across multiple different temperatures and/or operating conditions of the display. Furthermore, once the ESR is calculated, the current and/or voltage at an end of a route from the power circuitry to the display panel may be measured. When this current and/or voltage changes, the power circuitry may be driven differently to compensate for the change. For example, when the voltage across an organic light emitting diode (OLED) drops, a corresponding voltage (e.g., ELVDD or ELVSS) may be adjusted in a corresponding direction, such as increasing EVLDD and/or decreasing ELVSS, to achieve a target voltage across the OLED.

Figure 1:
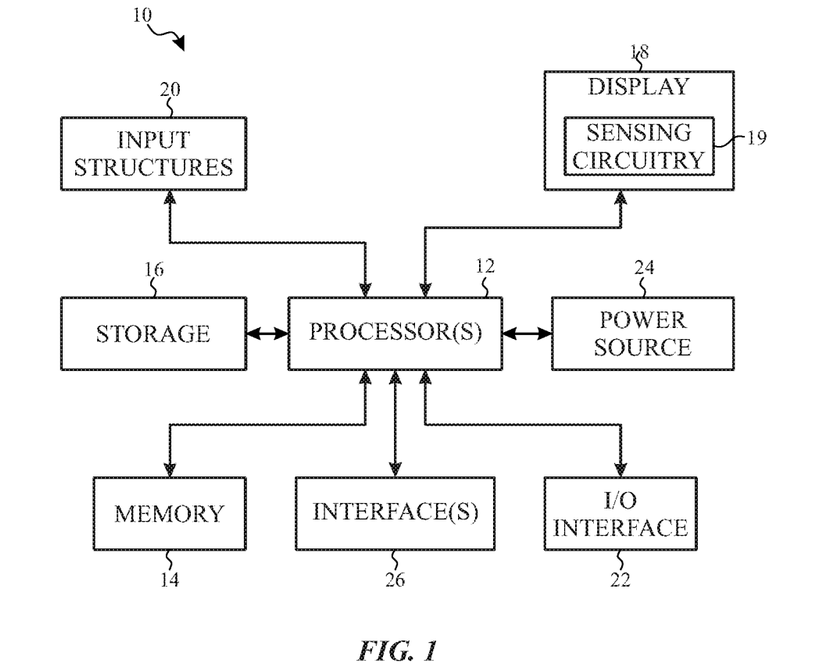
FIG. 1 is a schematic block diagram of an electronic device including a display, in accordance with an embodiment.

With the foregoing in mind and referring first to FIG. 1, an electronic device 10 according to an embodiment of the present disclosure may include, among other things, one or more processor(s) 12, memory 14, nonvolatile storage 16, a display 18, input structures 20, an input/output (I/O) interface 22, a power source 24, and interface(s) 26. The various functional blocks shown in FIG. 1 may include hardware elements (e.g., including circuitry), software elements (e.g., including computer code stored on a computer-readable medium) or a combination of both hardware and software elements. It should be noted that FIG. 1 is merely one example of a particular implementation and is intended to illustrate the types of components that may be present in electronic device 10.

In the electronic device 10 of FIG. 1, the processor(s) 12 and/or other data processing circuitry may be operably coupled with the memory 14 and the nonvolatile storage 16 to perform various algorithms. Such programs or instructions, including those for executing the techniques described herein, executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and/or optical discs. Also, programs (e.g., an operating system) encoded on such a computer program product may also include instructions that may be executed by the processor(s) 12 to enable the electronic device 10 to provide various functionalities.

In certain embodiments, the display 18 may be a liquid crystal display (e.g., LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more light emitting diode (e.g., LED) displays, or some combination of LCD panels and LED panels. The display 18 may include sensing circuitry 19 that is used to sense non-uniformity of the display 18 by sensing changes in voltage/current through thin-film transistors (TFTs) and/or emissive elements in the display 18.

The input structures 20 of the electronic device 10 may enable a user to interact with the electronic device 10 (e.g., pressing a button to increase or decrease a volume level, a camera to record video or capture images). The I/O interface 22 may enable the electronic device 10 to interface with various other electronic devices. Additionally or alternatively, the I/O interface 22 may include various types of ports that may be connected to cabling. These ports may include standardized and/or proprietary ports, such as USB, RS232, APPLE'S LIGHTNING® connector, as well as one or more ports for a conducted RF link.

As further illustrated, the electronic device 10 may include the power source 24. The power source 24 may include any suitable source of power, such as a rechargeable lithium polymer (e.g., Li-poly) battery and/or an alternating current (e.g., AC) power converter. The power source 24 may be removable, such as a replaceable battery cell.

The interface(s) 26 enable the electronic device 10 to connect to one or more network types. The interface(s) 26 may also include, for example, interfaces for a personal area network (e.g., PAN), such as a BLUETOOTH network, for a local area network (e.g., LAN) or wireless local area network (e.g., WLAN), such as an 802.11 Wi-Fi network or an 802.15.4 network, and/or for a wide area network (e.g., WAN), such as a 3rd generation (e.g., 3G) cellular network, 4th generation (e.g., 4G) cellular network, or long term evolution (e.g., LTE) cellular network. The interface(s) 26 may also include interfaces for, for example, broadband fixed wireless access networks (e.g., WiMAX), mobile broadband Wireless networks (e.g., mobile WiMAX), and so forth.

Figure 2:
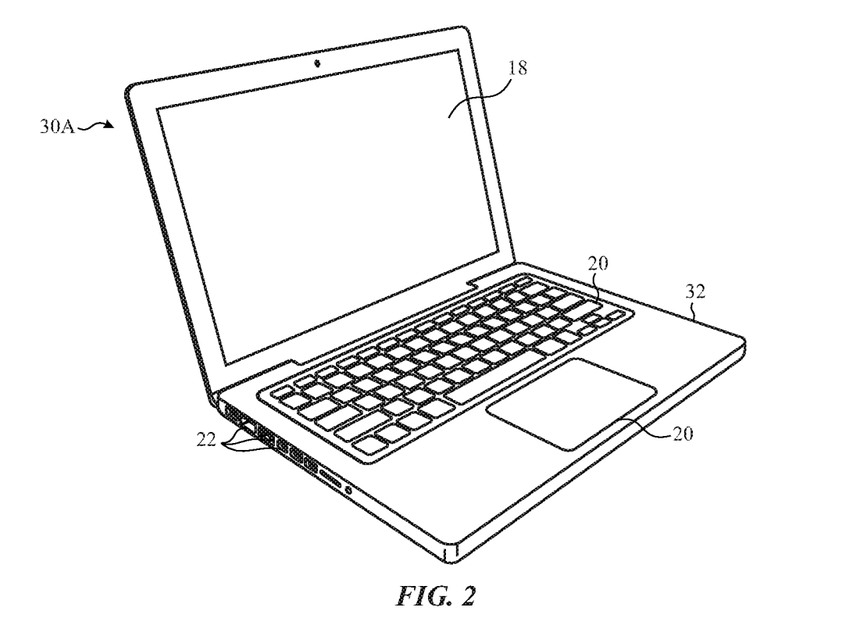
FIG. 2 is a perspective view of a notebook computer representing an embodiment of the electronic device of FIG. 1, in accordance with an embodiment.
Figure 3:
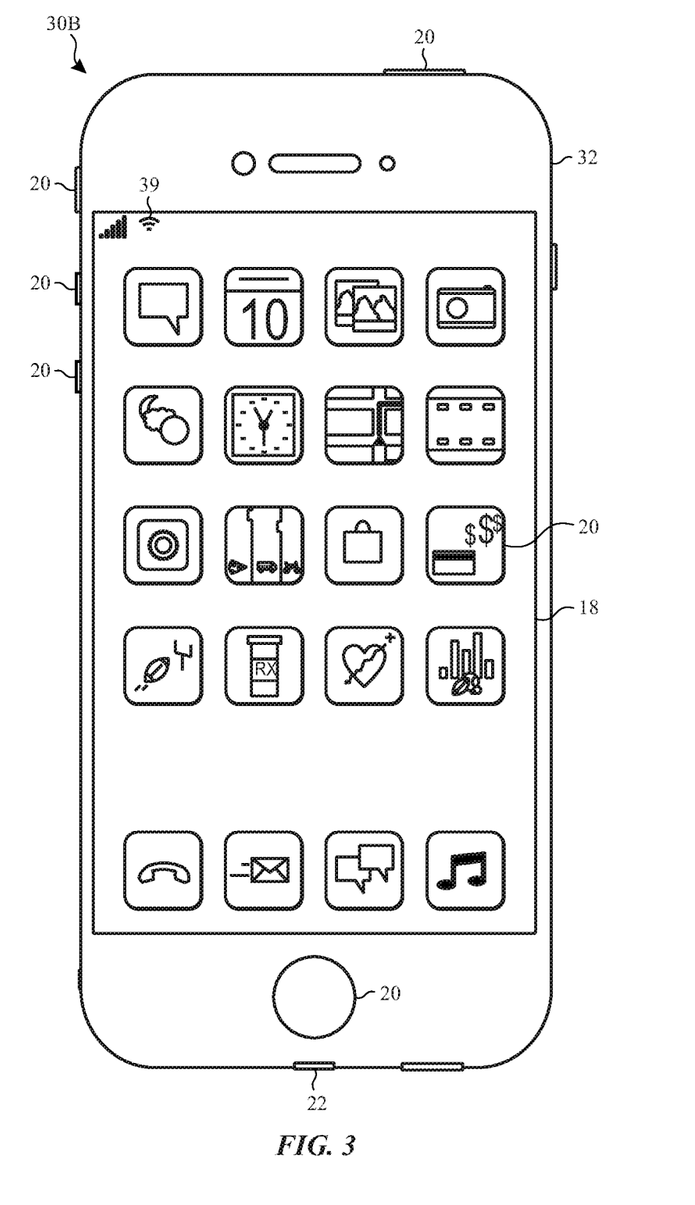
FIG. 3 is a front view of a hand-held device representing another embodiment of the electronic device of FIG. 1, in accordance with an embodiment.
Figure 4:
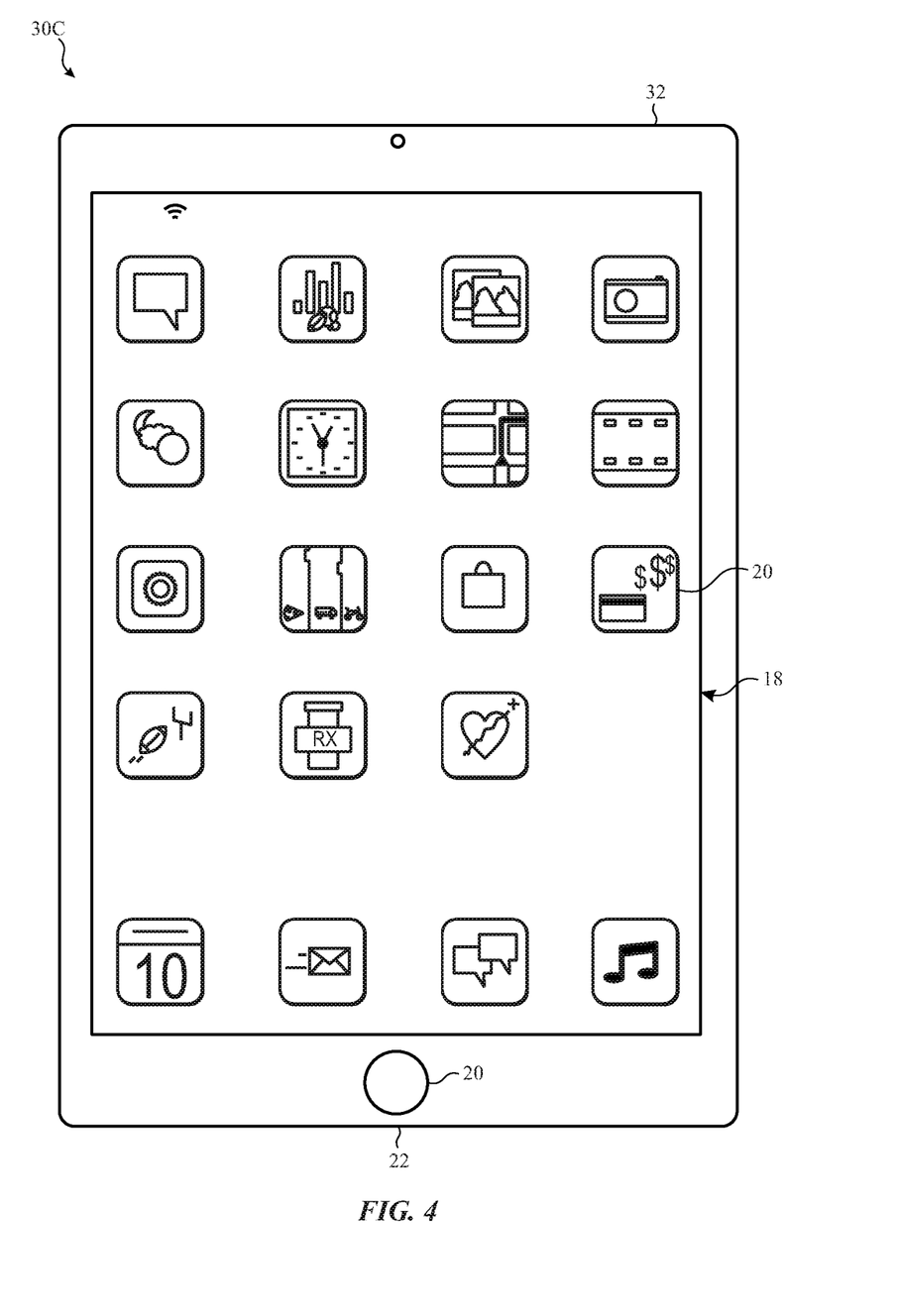
FIG. 4 is a front view of another hand-held device representing another embodiment of the electronic device of FIG. 1, in accordance with an embodiment.
Figure 5:
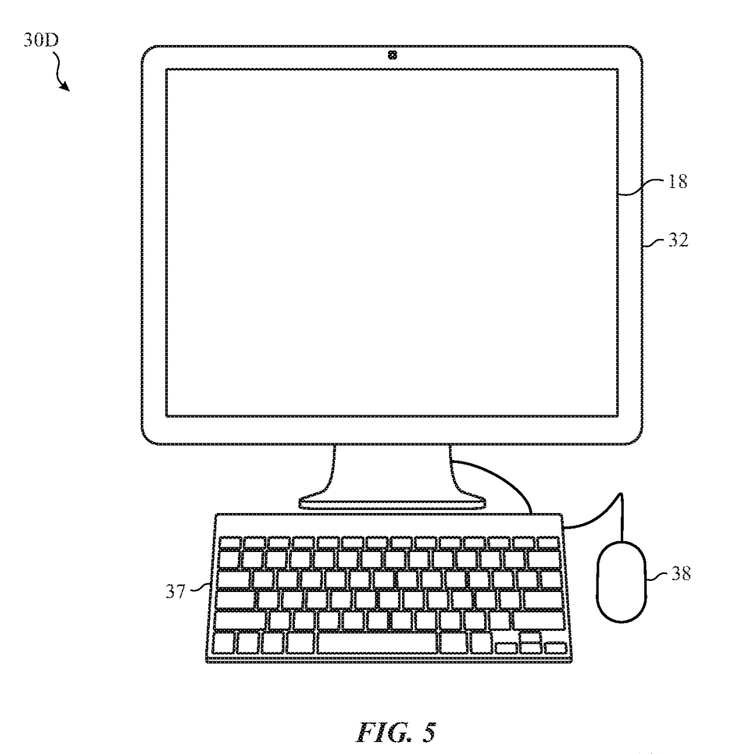
FIG. 5 is a front view of a desktop computer representing another embodiment of the electronic device of FIG. 1, in accordance with an embodiment.
Figure 6:
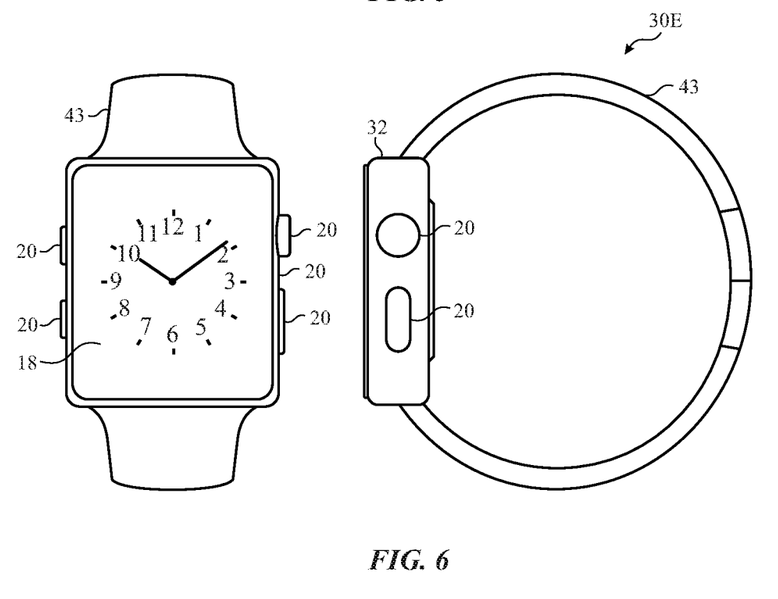
FIG. 6 is a front view of a wearable electronic device representing another embodiment of the electronic device of FIG. 1, in accordance with an embodiment.

By way of example, the electronic device 10 may represent a block diagram of the notebook computer depicted in FIG. 2, the handheld device depicted in either of FIG. 3 or FIG. 4, the desktop computer depicted in FIG. 5, the wearable electronic device depicted in FIG. 6, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In certain embodiments, the electronic device 10 may take the form of a computer, a portable electronic device, a wearable electronic device, or other type of electronic device. Such computers may include computers that are generally portable (e.g., such as laptop, notebook, and tablet computers) as well as computers that are generally used in one place (e.g., such as conventional desktop computers, workstations and/or servers). In certain embodiments, the electronic device 10 in the form of a computer may be a model of a MACBOOK®, MACBOOK® Pro, MACBOOK AIR®, IMAC®, MAC® mini, or MAC PRO® available from APPLE INC. By way of example, the electronic device 10, taking the form of a notebook computer 30A, is illustrated in FIG. 2 in accordance with one embodiment of the present disclosure. The depicted computer 30A may include a housing or enclosure 32, a display 18, input structures 20, and ports of the I/O interface 22. In one embodiment, the input structures 20 (e.g., such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents one embodiment of the electronic device 10. The handheld device 30B may represent, for example, a portable phone, a media player, a personal data organizer, a handheld game platform, or any combination of such devices. By way of example, the handheld device 30B may be a model of an IPOD® or IPHONE® available from APPLE INC. of Cupertino, Calif.

The handheld device 30B may include an enclosure 32 to protect interior components from physical damage and to shield them from electromagnetic interference. The enclosure 32 may surround the display 18, which may display indicator icons. The indicator icons may indicate, among other things, a cellular signal strength, BLUETOOTH connection, and/or battery life. The I/O interfaces 22 may open through the enclosure 32 and may include, for example, an I/O port for a hard-wired connection for charging and/or content manipulation using a connector and protocol, such as the Lightning connector provided by APPLE INC., a universal serial bus (e.g., USB), one or more conducted RF connectors, or other connectors and protocols.

The illustrated embodiments of the input structures 20, in combination with the display 18, may allow a user to control the handheld device 30B. For example, a first input structure 20 may activate or deactivate the handheld device 30B, one of the input structures 20 may navigate user interface to a home screen, a user-configurable application screen, and/or activate a voice-recognition feature of the handheld device 30B, while other of the input structures 20 may provide volume control, or may toggle between vibrate and ring modes. Additional input structures 20 may also include a microphone that may obtain a user's voice for various voice-related features, and a speaker to allow for audio playback and/or certain phone capabilities. The input structures 20 may also include a headphone input (not illustrated) to provide a connection to external speakers and/or headphones and/or other output structures.

FIG. 4 depicts a front view of another handheld device 30C, which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an IPAD® available from APPLE INC. of Cupertino, Calif.

Turning to FIG. 5, a computer 30D may represent another embodiment of the electronic device 10 of FIG. 1. The computer 30D may be any computer, such as a desktop computer, a server, or a notebook computer, but may also be a standalone media player or video gaming machine. By way of example, the computer 30D may be an IMAC®, a MACBOOK®, or other similar device by APPLE INC. It should be noted that the computer 30D may also represent a personal computer (e.g., PC) by another manufacturer. A similar enclosure 32 may be provided to protect and enclose internal components of the computer 30D such as the display 18. In certain embodiments, a user of the computer 30D may interact with the computer 30D using various peripheral input devices, such as a keyboard 37 or a mouse 38, which may connect to the computer 30D via an I/O interface 22.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 43, may be an APPLE WATCH® by APPLE INC. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 30E may include a touch screen (e.g., LCD, an organic light emitting diode display, an active-matrix organic light emitting diode (e.g., AMOLED) display, and so forth), which may allow users to interact with a user interface of the wearable electronic device 30E.

Although the following discusses sensing current through an OLED as a pixel, some embodiments may include measuring other parameters suitable for other pixel types. For example, LED voltage may be sensed at LED pixels in the display.

Figure 7:
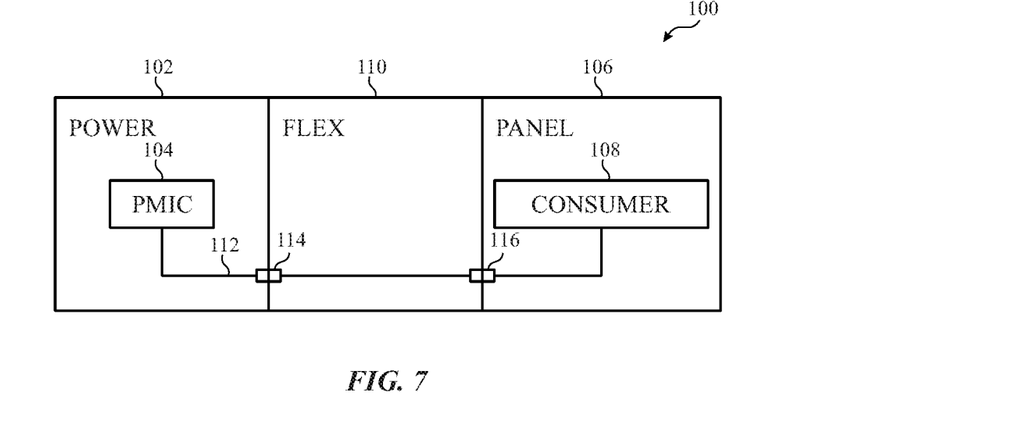
FIG. 7 illustrates a block diagram view of a display system, in accordance with an embodiment.
Figure 8:
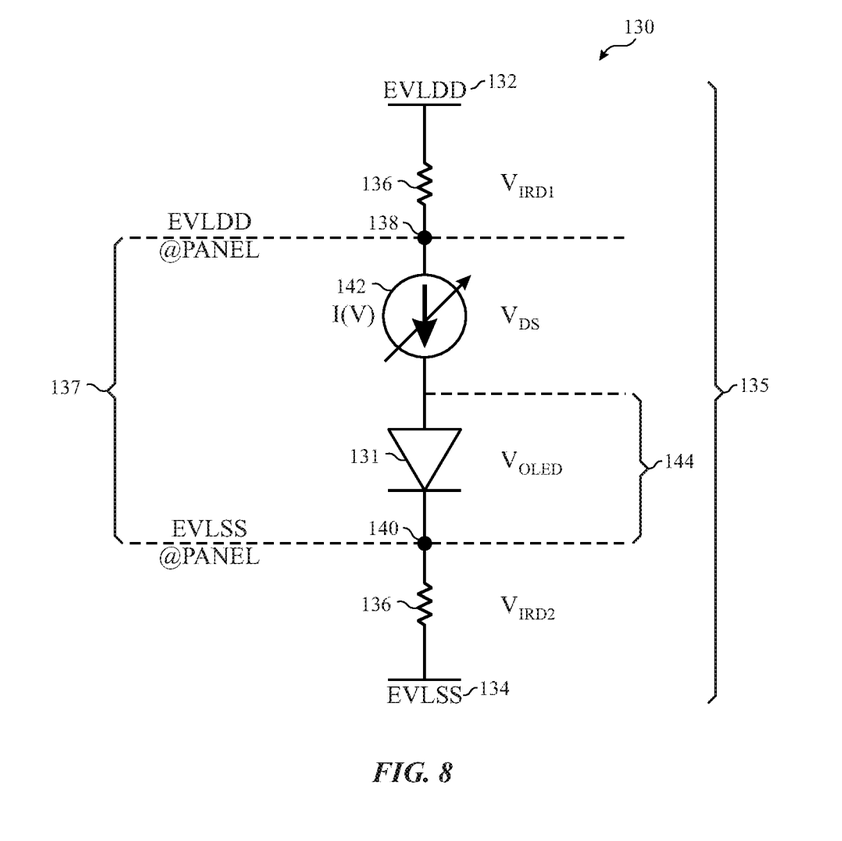
FIG. 8 illustrates a schematic diagram of circuitry having a self-emissive unit, in accordance with an embodiment.

FIG. 7 illustrates a block diagram view of a display system 100. The display system 100 includes a power unit 102 that includes a power management integrated circuit (PMIC) 104 that manages and provides power to a display panel 106 that includes one or more consumers 108 through a connection 110 (e.g., flex connector). For example, the consumers 108 may include multiple self-emissive units (e.g., organic light-emitting diodes OLED) that convert electrical power to emitted light. The power transmitted from the PMIC 104 is transmitted through one or more routes 112 that may each may include one or more contact points 114 and 116 that couple one or more components. For example, the contact points 114 and/or 116 may include a pad where components may be joined (e.g., soldered) and/or physically connected (e.g., couplers). However, the routes 112 and/or the contact points 114 and/or 116 may cause a change in resistivity between the PMIC 104 and the consumer 108. Furthermore, this change in resistivity may also cause a change in a supplied current to the consumer 108. This current drop may be attributed to resistances in the route 112 to the consumer 108. For example, FIG. 8 illustrates a schematic diagram of circuitry 130 having a self-emissive unit 131 (e.g., OLED). The PMIC 104 provides an ELVDD 132 and an ELVSS 134 to provide a provided voltage 135. However, resistances 136 in the line may diminish a panel voltage 137 due to a voltage difference between a node 138 and ELVDD 132. Furthermore, these resistances 136 at another end of the self-emissive unit 131 may cause a voltage difference between the ELVSS 134 and a voltage at a node 140. In other words, the display panel voltage 137 (voltage difference between nodes 138 and 140) may be different than the provided voltage 135 due to Ohm's law properties. This change (e.g., drop) in voltage may cause a resultant change (e.g., drop) in current causing a change in emission of light by the self-emissive unit 131. Furthermore, the resistances 136 may change with temperature of the display 18. Accordingly, this current may be monitored using a measurement of $V_{OLED}$ 144 across the self-emissive unit 131. In some embodiments, measurement of a current through the route 112 may be used to estimate/calculate and compensate for the $V_{OLED}$ 144 changes to reduce the impact on of the resistances 136 on the self-emissive unit 131 due to current drop. In some embodiments, monitoring the current may additionally or alternatively be used to measure an equivalent series resistance (ESR) of the route 112 between the PMIC 104 and the consumer 108.

Figure 9:
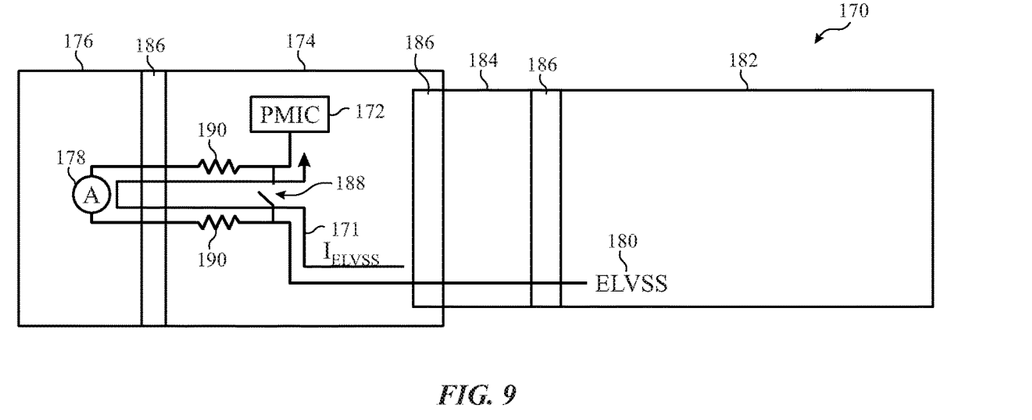
FIG. 9 illustrates a schematic diagram of a sensing configuration used to sense current from a power management integrated circuit (PMIC), in accordance with an embodiment.
Figure 10:
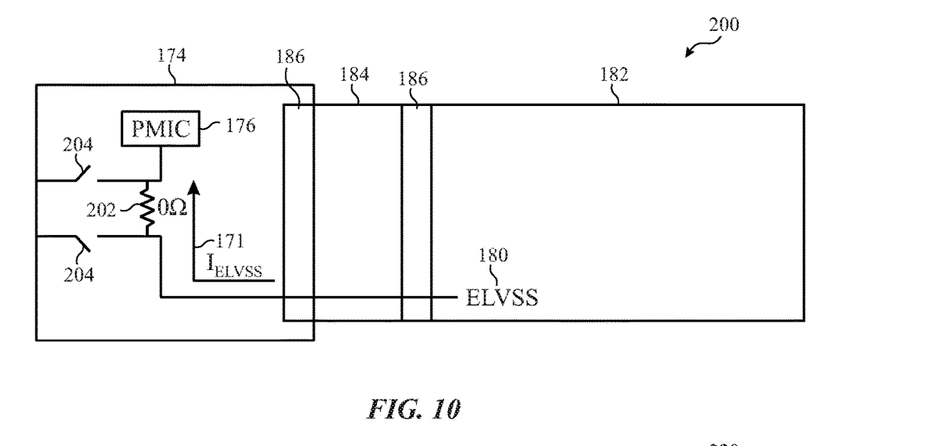
FIG. 10 illustrates a schematic diagram of an operation configuration used to operate a display panel, in accordance with an embodiment.

FIGS. 9 & 10 illustrate a bi-configuration system that includes a first configuration for current sensing through the route 112 to determine current drop and a second configuration for regular operation. FIG. 9 illustrates a sensing configuration 170 that is used to sense a current 171 between a PMIC 172 in power circuitry 174 through testing circuitry 176 including a current sensing unit 178. The current 171 is passed at a supplied voltage 180 to a display panel 182. The current 171 may be passed through intermediate connectors 184 (e.g., flex) between the power circuitry 174 and the display panel 182. Furthermore, the testing circuitry 176, the power circuitry 174, the intermediate connectors 184, and/or the display panel 182 may be connected to adjacent components using connectors 186 (e.g., board-to-board interfaces) that provide electrical connections through the various components. As illustrated, a switch 188 may remain open in the sensing configuration to force the current 171 through the current sensing unit 178 through low impedance paths 190.

In an operation configuration 200, illustrated in FIG. 10, the switch 188 is closed to form a low impedance path 202 bypassing the current sensing unit 178. Additionally, the low impedance paths 190 may be switched to open using switches 204 to prevent the current 171 from passing through the current sensing unit 178. However, this bi-configuration system utilizes external components that use additional connections that may increase a risk of desense condition where degradation of signals in the circuit occurs due to noise sources.

Figure 11:
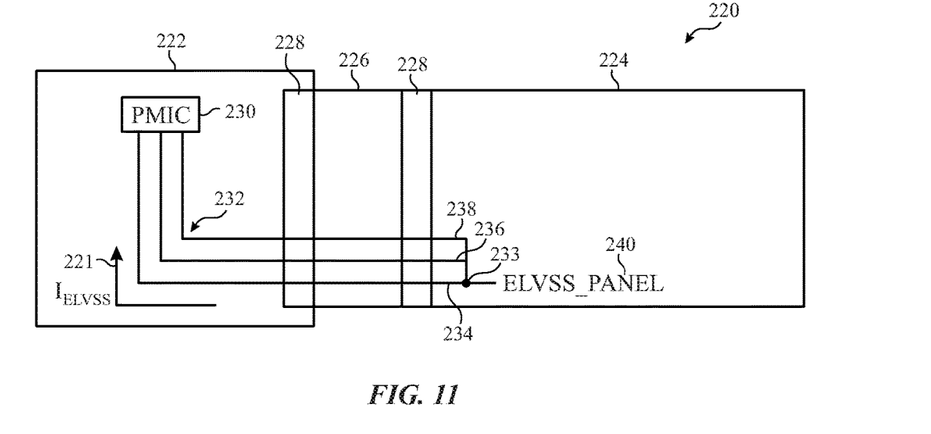
FIG. 11 illustrates a schematic diagram of a single configuration system configured to sense electrical properties and to operate a display panel, in accordance with an embodiment.

To alleviate such issues related to the bi-configuration system, a single configuration system 220, illustrated in FIG. 11, may be utilized to provide operation and/or to sense a current 221 from power circuitry 222 to a panel 224. The current 221 may be passed through intermediate components 226 via one or more connectors 228. Furthermore, one or more paths 232 may be used to transport the current 221 and to sense a current and/or a voltage at a node 233 along a path 234 of the one or more paths 232. The path 234 may be used to deliver the current. Other paths may be used to sample and determine various electrical properties at the node 233. For example, a path 236 may be used to sample a current at the node 233, and/or a path 238 may be used to sample a voltage at the node 233. In some embodiments, sampling the current and/or voltage may include pumping in a signal with a known current and/or voltage to determine electrical properties at the node 233.

Figure 12:
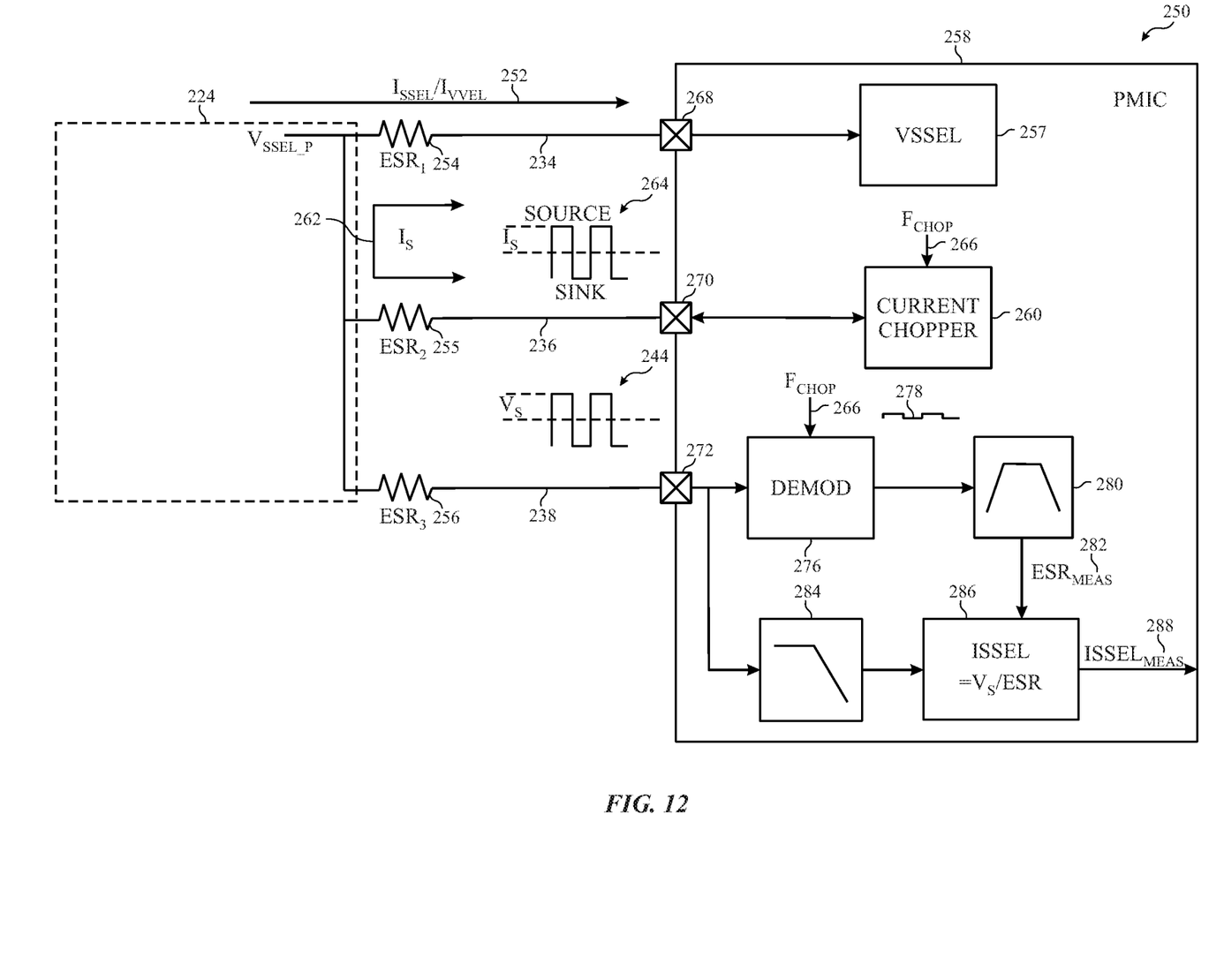
FIG. 12 illustrates a block diagram of sensing scheme used to sense electrical properties from a PMIC, in accordance with an embodiment.

FIG. 12 illustrates a sensing scheme 250 used to determine a voltage and/or current at the node 233 that may be used with the single configuration system 220 of FIG. 11. As illustrated, the sensing scheme 250 includes passing a current 252 through circuitry having an equivalent series resistance (ESR) 254 along the path 234. Similarly, other paths 236 and 238 have ESRs 255 and 256, respectively. The ESRs 254, 255, and 256 may correspond to resistances in the paths 234, 236, and 238, respectively, along with any contact points occurring in the paths. In other words, the ESR 254 may correspond to an overall resistance through the path 234. Similarly, the ESRs 255 and 256 may correspond to overall resistances through the paths 236 and 238, respectively. In some embodiments, the ESRs 254, 255, and/or 256 may at least partially fluctuate with temperature and/or other operating parameters of the display 18. The current 252 is passed through the path having the ESR 254 to/from a voltage source 257 in a PMIC 258.

The sensing scheme 250 may also utilize a current chopper 260 to provide a sensing current. The sensing current may be a modulated signal, such as a waveform 262, that may be generated using the current chopper 260. The frequency of the modulation of the sensing current may be set using a chopping frequency 266 that is input into the current chopper 260. This chopping frequency 266 may be used to set the frequency of the waveform 262. The chopping frequency 266 may be selected at a frequency (e.g., high frequency relative to a refresh rate of the display) that is determined to impact display quality of the display 18 less dramatically than other frequencies. For example, the chopping frequency 266 may be set according to panel results and/or may be set with a frequency that is above a detectability threshold of human perception. The chopping frequency 266 may also be selected to reduce and/or minimize possibility of synchronization of the sensing current with the PMIC 258. The sensing current passes through a node 268 corresponding to the path 234 from a node 270 corresponding to the path 236. However, in some embodiments, no current is passed through a node 272 of the path 238 due to the node 272 having a high impedance. Instead, the node 272 may be used to detect a voltage, such as a waveform 274. This waveform 274 is then passed to a demodulator 276 that demodulates the waveform 274 using the chopping frequency 266 that is input to the demodulator 276 in addition to the current chopper 260. This demodulation 276 results in a waveform 278. This waveform 278 is then submitted to a high-pass filter 280 to obtain $ESR_{MEAS}$ 282. The PMIC 258 also detects the voltage, as illustrated in waveform 274, using a low pass filter 284. This voltage, Vs, is passed to calculation circuitry 286 that receives the $ESR_{MEAS}$ 282 and the voltage. The calculation circuitry 286 divides the voltage by the $ESR_{MEAS}$ 282 to calculate a measured current 288 for the current 252.

Figure 13:
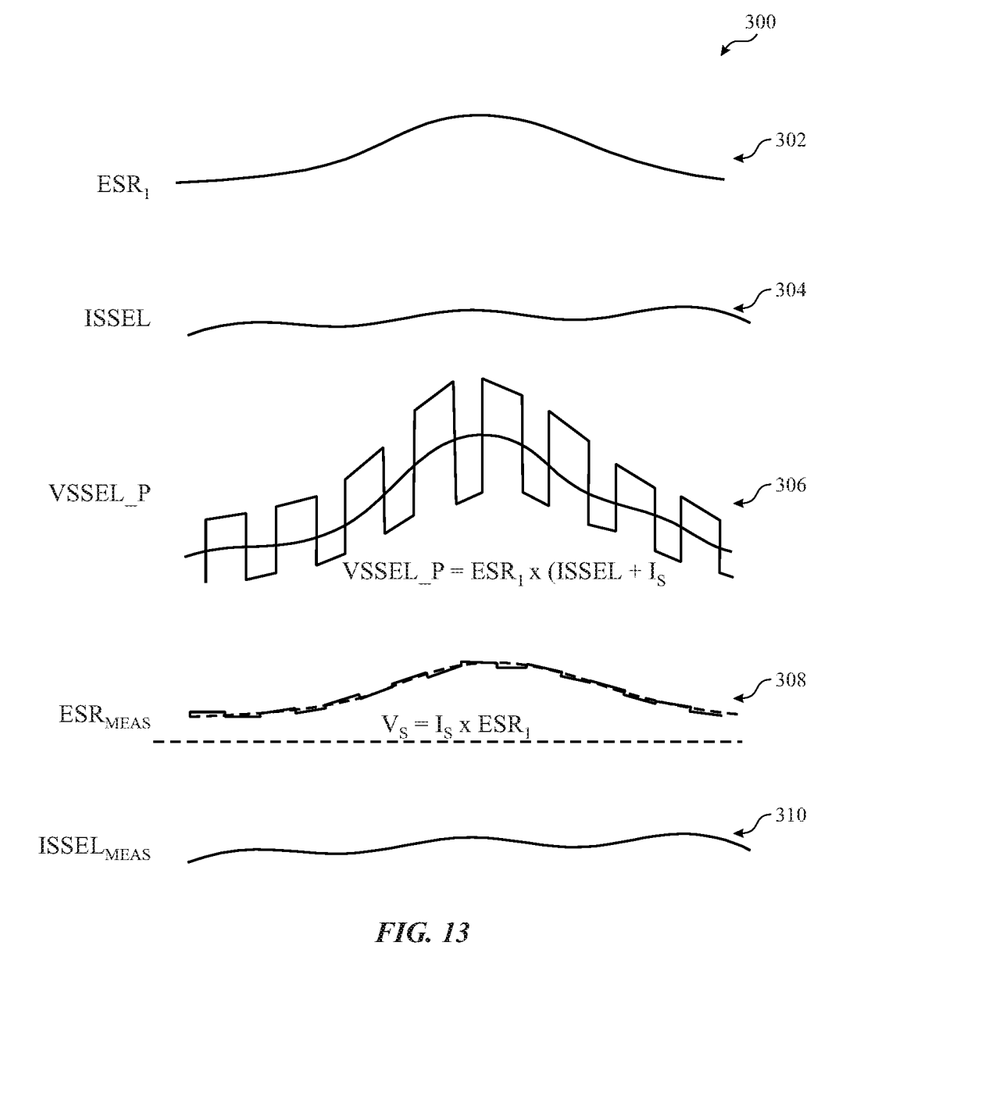
FIG. 13 illustrates example values that may occur in sensing using the sensing scheme of FIG. 12, in accordance with an embodiment.

In other words, the sensing scheme 250 may be used to track the ESRMEAS 282 and the measured current 288 to provide for compensation of fluctuations of the operation of the display 18. FIG. 13 illustrates example values 300 that may occur during operation using the sensing scheme 250. For example, an ESR 302 may fluctuate due to various operating parameters of the display, such as temperature of the path 234. The changes to the ESR 302 may cause changes in current, as reflected in the current 304. A modulated signal 306 may occur at an end of the path 234 at an opposite end of the path 234 from the PMIC 258. As previously discussed, the signal 306 may be generated using the current chopper 260 and the chopping frequency 266 that is combined with the current 252. The signal 306, as previously discussed, is used to determine an $ESR_{MEAS}$ 308 and a measured current 310.

Figure 14:
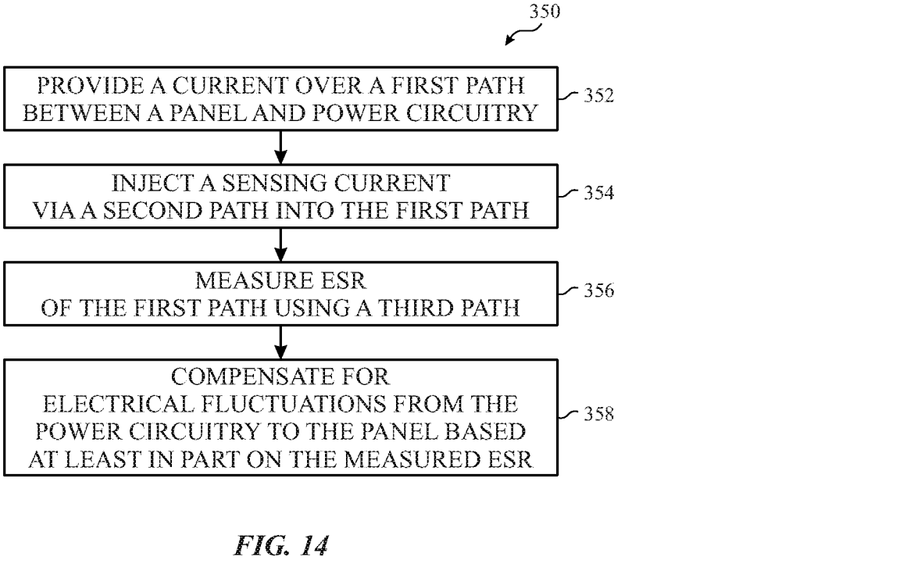
FIG. 14 illustrates a flow diagram view of a process that may be used to measure and compensate for an ESR between a panel and a PMIC, in accordance with an embodiment.

FIG. 14 illustrates a process 350 that may be used to measure an ESR between a panel and a PMIC. Power circuitry provides a current over a first path between a panel and the power circuitry containing the PMIC (block 352). The current may be an operating current used to operate the display panel. The power circuitry also injects a sensing current via a second path from the power circuitry into the first path (block 354). For example, the sensing current may be injected into a node of the first path disposed at or adjacent to the display panel at an opposite end of the first path from the power circuitry. The sensing current may include a chopped current signal that is chopped at a frequency that may be selected to reduce or eliminate visibility of the injected sensing current on the display 18.

The power circuitry measures an ESR of the first path using a third path from the power circuitry (block 356). For example, as previously discussed, the power circuitry may induce a combined signal combining the sensing current and the provided current. Knowing the injected sensing current, the power circuitry may extract a component corresponding to the sensing current to determine the ESR of the first path. The measured ESR may be used to compensate for electrical fluctuations from the power circuitry to the display panel (block 358). For example, by measuring the ESR, current drop between the display panel and the power circuitry may be tracked and compensated for. In other words, when the current drop increases, the provided current may be increased, but when the current drop decreases, the provided current may be decreased.

Figure 15:
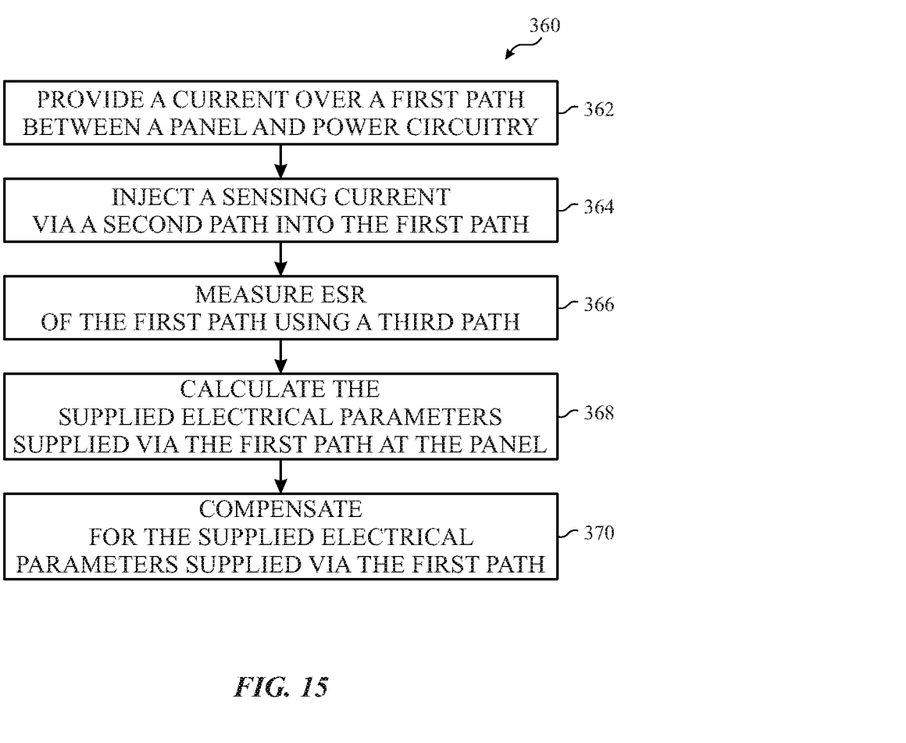
FIG. 15 illustrates a flow diagram of a process that may be used to measure and compensate for electrical parameters supplied from power circuitry to a display panel, in accordance with an embodiment.

FIG. 15 illustrates a process 360 that may be used to measure electrical parameters supplied from power circuitry to a display panel. The power circuitry provides a current over a first path between a panel and the power circuitry (block 362). The current may be an operating current used to operate the display panel. The power circuitry also injects a sensing current via a second path from the power circuitry into the first path (block 364). For example, the sensing current may be injected into a node of the first path disposed at or adjacent to the display panel at an opposite end of the first path from the power circuitry. The sensing current may include a chopped current signal that is chopped at a frequency that may be selected to reduce or eliminate visibility of the injected sensing current on the display 18.

The power circuitry measures an ESR of the first path using a third path from the power circuitry (block 366). For example, as previously discussed, the power circuitry may induce a combined signal combining the sensing current and the provided current. Knowing the injected sensing current, the power circuitry may extract a component corresponding to the sensing current to determine the ESR of the first path.

The power circuitry and/or the processor(s) 12 may be used to calculate supplied electrical parameters supplied via the first path at the display panel (block 368). The power circuitry and/or the processor(s) 12 may be used to compensate for the supplied electrical parameter fluctuations (block 370). For example, the power circuitry may utilize the combined signal to determine voltage levels in the first path at the display panel. In some embodiments, this voltage may be used compensate for fluctuations of the voltage and/or may be used to compute a current that is then used to compensate for current fluctuations. For example, the ESR and the voltage may be used to determine a current to the display panel, and the power circuitry and/or the processor(s) may be used to compensate for the current fluctuations.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure. Furthermore, it should be further understood that each of the embodiments disclosed above may be used with any and all of the other embodiments disclosed herein. The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A method comprising:
providing a current from power circuitry over a first path between a display panel and the power circuitry;
generating a sensing current using a current chopper to modulate the sensing current;
injecting the sensing current into the first path via a second path between the power circuitry and the first path;
measuring an equivalent series resistance (ESR) of the first path using a third path and the sensing current; and
compensating for electrical fluctuations from the power circuitry to the display panel based at least in part on the measured ESR, wherein the first, second, and third paths comprise distinct hardwired paths that are each separately and concurrently coupled from the power circuitry to the display panel.

2. The method of claim 1, wherein generating the sensing current comprises receiving a chopping frequency used to modulate the sensing current.

3. The method of claim 2, wherein the chopping frequency is configured to reduce or minimize visibility of the sensing current on the display panel.

4. The method of claim 3, wherein the chopping frequency comprises a frequency that is above a threshold of human detectability.

5. The method of claim 3, wherein the chopping frequency is selected to prevent synchronization with operation of the power circuitry.

6. The method of claim 1, wherein measuring the ESR comprises:
combining the sensing current and the current into a combined signal in the third path; and
receiving the combined signal at the power circuitry via the third path.

7. The method of claim 6 comprising demodulating the combined signal after receipt via the third path.

8. The method of claim 7, comprising filtering the demodulated combined signal to generate an ESR measurement.

9. The method of claim 1, wherein the current is an operating current used to operate the display panel.

10. The method of claim 1, comprising tracking current drop between the display panel and the power circuitry by measuring the ESR.

11. A system comprising:
a plurality of routes between power circuitry and a display panel; and
the power circuitry, wherein the power circuitry is configured to provide power management for the display panel and to determine electrical properties of at least one of the plurality of routes, wherein the power circuitry couples to the plurality of routes and comprises:
a first node to receive a first route of the plurality of routes;
a second node to receive a second route of the plurality of routes;
a third node to receive a third route of the plurality of routes;
a current chopper to inject via the second node a sensing current on top of a signal over the first route to form a combined signal;

a demodulator to extract the signal from the combined signal received at the third node; and a filter to extract an electrical property of the first route from the demodulated combined signal, wherein the first, second, and third routes comprise distinct hardwired paths that are each separately and concurrently coupled from the display panel to the power circuitry.

12. The system of claim 11, wherein the third node comprises a high impedance node relative to the first node.

13. The system of claim 11, wherein the electrical property comprises an equivalent series resistance (ESR) of the first route.

14. The system of claim 13 comprising a processor configured to compensate the power management for ESR changes in the first route due to a temperature of the first route or an operating condition of the display panel.

15. The system of claim 11 comprising calculation circuitry that receives the electrical property and is used to calculate a current based on the electrical property and a voltage derived from the combined signal using a low pass filter.

16. The system of claim 15 comprising a processor configured to compensate the power management of the power circuitry for changes to the current.

17. The system of claim 11, wherein the power circuitry is configured to monitor a voltage at the display panel through the first route.

18. The system of claim 17 comprising a processor configured to compensate the power management for changes to the voltage.

19. A method comprising:

supplying a current over a first path between a display panel and power circuitry;

generating a sensing current using a current chopper to modulate the sensing current;

injecting the sensing current onto the first path via a second path from the display panel to a node on the first path at the display panel;

measuring an equivalent series resistance for the first path using a third path from the power circuitry to the node;

calculating supplied electrical parameters supplied from the power circuitry via the first path to the node based at least in part on the equivalent series resistance; and compensating operation of the power circuity for changes to the supplied electrical parameters, wherein the first, second, and third paths comprise distinct hardwired paths that are each separately and concurrently coupled from the power circuitry to the display panel during driving of the display panel by the power circuitry.

* * * * *